(12) United States Patent
Iisaka et al.

(10) Patent No.: US 10,448,551 B2
(45) Date of Patent: Oct. 15, 2019

(54) COMPONENT MOUNTER

(71) Applicant: FUJI CORPORATION, Chiryu-shi (JP)

(72) Inventors: Jun Iisaka, Nisshin (JP); Hidetoshi Ito, Okazaki (JP)

(73) Assignee: FUJI CORPORATION, Chiryu-shi (JP)

( * ) Notice: Subject to any disclaimer, the term of this patent is extended or adjusted under 35 U.S.C. 154(b) by 50 days.

(21) Appl. No.: 15/574,525

(22) PCT Filed: May 25, 2015

(86) PCT No.: PCT/JP2015/064906
§ 371 (c)(1),
(2) Date: Nov. 16, 2017

(87) PCT Pub. No.: WO2016/189621
PCT Pub. Date: Dec. 1, 2016

(65) Prior Publication Data
US 2018/0153061 A1   May 31, 2018

(51) Int. Cl.
*H05K 13/04*   (2006.01)
*G06T 7/73*   (2017.01)
(Continued)

(52) U.S. Cl.
CPC ......... *H05K 13/0413* (2013.01); *G06T 7/001* (2013.01); *G06T 7/60* (2013.01);
(Continued)

(58) Field of Classification Search
None
See application file for complete search history.

(56) References Cited

U.S. PATENT DOCUMENTS 4,951,383 A * 8/1990 Amao .................. H05K 13/021
29/721
5,539,977 A   7/1996 Kano et al.
(Continued)

FOREIGN PATENT DOCUMENTS

JP   64-74800 A   3/1989
JP   7-131191 A   5/1995
(Continued)

OTHER PUBLICATIONS

Extended European Search Report dated Apr. 9, 2018 in European Patent Application No. 15893256.6, 7 pages.
(Continued)

*Primary Examiner* — Fayyaz Alam
(74) *Attorney, Agent, or Firm* — Oblon, McClelland, Maier & Neustadt, L.L.P.

(57) ABSTRACT

A nozzle section is held by a nozzle holder to be vertically movable, and the nozzle section is biased downwards by springs. A height position reference section for which image recognition is possible is provided on an outer circumferential section of the nozzle section. Both a component held on the lower end of the nozzle section and the height position reference section are in the field of view of a camera that captures a side view image of an area around the lower end of the nozzle section. The side view image is processed, the height position reference section and a height position of the lower end of the component are recognized, a height difference from the height position reference section to the lower end of the component is measured, and it is determined whether the pickup orientation of the component is acceptable based on the height difference.

7 Claims, 7 Drawing Sheets

(51) Int. Cl.
*G06T 7/00* (2017.01)
*G06T 7/60* (2017.01)
*H05K 13/08* (2006.01)

(52) U.S. Cl.
CPC ........... *G06T 7/74* (2017.01); *H05K 13/0409* (2018.08); *H05K 13/08* (2013.01); *H05K 13/0813* (2018.08); *G06T 2207/30141* (2013.01); *G06T 2207/30164* (2013.01)

(56) References Cited

U.S. PATENT DOCUMENTS

| | | | | |
|---|---|---|---|---|
| 2003/0070289 | A1* | 4/2003 | Hwang | H05K 13/0452 29/833 |
| 2006/0158831 | A1* | 7/2006 | Sakai | H05K 13/0812 361/600 |
| 2007/0091323 | A1 | 4/2007 | Manickam et al. | |
| 2013/0120554 | A1* | 5/2013 | Suzuki | H01L 21/67132 348/87 |
| 2015/0262848 | A1* | 9/2015 | Sano | H01L 21/6708 156/345.17 |
| 2016/0227682 | A1 | 8/2016 | Matsuda | |
| 2017/0307544 | A1* | 10/2017 | Nagata | G01N 21/88 |

FOREIGN PATENT DOCUMENTS

| | | |
|---|---|---|
| JP | 9-83192 A | 3/1997 |
| JP | 11-31899 A | 2/1999 |
| JP | 2001-189600 A | 7/2001 |
| JP | 2005-322802 A | 11/2005 |
| JP | 2006-313838 A | 11/2006 |
| JP | 2008-124293 A | 5/2008 |
| JP | 2009-88035 A | 4/2009 |
| JP | 4896136 B2 | 3/2012 |
| JP | 2015-70176 A | 4/2015 |
| WO | WO 2014/080525 A1 | 5/2014 |
| WO | WO 2015/052832 A1 | 4/2015 |
| WO | WO-2015045649 A1 * 4/2015 ......... H05K 13/0812 |

OTHER PUBLICATIONS

International Search Report dated Aug. 11, 2015 in PCT/JP2015/064906 Filed May 25, 2015.

* cited by examiner (a) Normal pickup (b) Nozzle section raised with normal pickup (c) Nozzle section raised with slanted pickup

COMPONENT MOUNTER

TECHNICAL FIELD

The present disclosure relates to a component mounter equipped with an image processing device that determines a pickup orientation of a component by performing image processing on a side view image captured by a camera of a component being held on a lower end of a nozzle section.

BACKGROUND ART

In component mounters, for example, as disclosed in patent literature 1 (JP-A-2006-313838) and patent literature 2 (JP-A-2009-88035), when picking up a component with a suction nozzle, or when mounting the component on a board, to prevent damage to the component due to impact, a nozzle section is provided to be vertically movable in a nozzle holder, and the nozzle section is biased downwards by a spring; after the lower end of the nozzle section contacts the component during component pickup operation, and after the component held by the nozzle section contacts the board during component mounting operation, the nozzle section is pushed against the elastic force of the spring in accordance with the lowering operation of the mounting head that holds the nozzle holder until the lowering operation stops, thereby lessening the impact on the component.

Also, as disclosed in patent literature 3 (JP-A-2008-124293) and patent literature 4 (JP-A-2009-88035), there are items in which a side view image of a held component is captured by a camera and image processed, and determinations are made such as whether the pickup orientation of the component is acceptable, whether the component is present or absent, or whether the nozzle section is in acceptable condition.

Specifically, with the determination method of patent literature 3, a side view image of a reference jig held on the nozzle holder instead of the nozzle section is captured and image processed as a "reference image", and a height position of the reference jig is obtained as a reference height position, then, the reference jig is removed from the nozzle holder, the nozzle section is attached to the nozzle holder, a side view image of a component held on the lower end of the nozzle section is captured and image processed, a height position of the lower end (lowest point) of the component is obtained, a height difference (difference) between the reference height position and the lower end of the component is calculated, and, based on the height error, a determination is made regarding the pickup orientation of the component, the condition of the nozzle section, and the like.

On the other hand, with the determination method of patent literature 4, a side view image is captured of an individual nozzle section that is in good condition, without defects or the like, as a "reference image", a side view image is captured of a nozzle section holding a component, a difference image is obtained between the side view image of the nozzle section and the reference image, and a determination is made regarding the pickup orientation of the component, the condition of the nozzle section, and the like.

CITATION LIST

Patent Literature

Patent literature 1: JP-A-2006-313838
Patent literature 2: JP-A-2009-88035
Patent literature 1: JP-A-2008-124293
Patent literature 4: JP-A-2009-88035

SUMMARY

With the determination methods of both patent literature 3 and 4, in addition to a side view image of a nozzle section holding a component, a reference image is necessary, therefore it is impossible to make a determination regarding the pickup orientation of the component, the condition of the nozzle section, and the like without a reference image.

Further, during component pickup operation or during component mounting operation, the nozzle section inserted in the nozzle holder is not necessarily always pushed by the spring correctly to the specified position (lower limit position) after component pickup operation or after component mounting operation, and the height position of the nozzle section varies slightly with each component pickup operation and each component mounting operation due to friction, adhered foreign matter, or the like; with the determination methods of both patent literature 3 and 4, because it is assumed that the height position of the nozzle section is always fixed (does not vary), if the height position of the nozzle section varies slightly with each component pickup operation or each component mounting operation, this may lead to worse determination accuracy of the pickup orientation of the component or the like, and to incorrect determination.

Because the thickness of components is becoming smaller as the miniaturization of components continues, the influence of slight variations in the height position of the nozzle section for each component pickup operation and each component mounting operation has a larger effect on the determination accuracy of the pickup orientation of the component and the like, leading to an increase in the frequency of incorrect determination of the pickup orientation of the component and the like.

Thus, to solve the above problems, an object of the present disclosure is to provide a component mounter capable of determining with good accuracy whether the pickup orientation of a component or the like is good with only one side view image, without requiring a reference image.

To solve the above problems, the present disclosure is a component mounter including: a nozzle section held in a nozzle holder to be vertically movable and biased downwards by a biasing means, the nozzle section having a height position reference section for which image recognition is possible provided on an outer circumference of the nozzle section; a camera configured to capture a side view image of a component held on a lower end of the nozzle section; an image processing device configured to determine whether a pickup orientation of the component is acceptable by processing the side view image; wherein both the component held on the lower end of the nozzle section and the height position reference section are caused to enter a field of view of the camera, the camera captures a side view image of an area around the lower end of the nozzle section, the side view image including the component and the height position reference position, and the image processing device processes the side view image, recognizes the height position reference section and a height position of a lower end of the component, measures a height difference from the height position reference section to the lower end of the component, and determines whether a pickup orientation of the component is acceptable based on the height difference.

With this configuration, the nozzle section has a height position reference section for which image recognition is possible provided on an outer circumference of the nozzle section, both the component held on the lower end of the nozzle section and the height position reference section are caused to enter a field of view of the camera, a side view image of an area around the lower end of the nozzle section is captured, and the height position reference section and a height position of a lower end of the component are recognized from the side view image; therefore, it is possible to determine with good accuracy a height difference from the height position reference section of the nozzle section to the lower end of the component with only one side view image, without requiring a reference image. Because the height difference from the height position reference section of the nozzle section to the lower end of the nozzle section is a known value from specification data (design value, reference value, dimension management data from manufacturing, or the like) of the nozzle section, it is possible to accurately estimate the height dimension (thickness dimension) of the component captured in the side view image as pickup orientation information from the measured value of the height difference from the height position reference section of the nozzle section to the lower end of the component. Here, the height position of the nozzle section varies slightly with each component pickup operation and each component mounting operation due to friction, adhered foreign matter, or the like, but because the height position reference section and the nozzle section move vertically together, the height difference from the height position reference section to the lower end of the component is not influenced at all by slight variations in the height position of the nozzle section, thus it is possible to accurately determine whether the pickup orientation of the component is acceptable based on the height difference from the height position reference section to the lower end of the component. Thus, it is possible to accurately determine whether the pickup orientation of the component is acceptable with only one side view image, without requiring a reference image, and without being influenced by slight variations in the height position of the nozzle section with each component pickup operation and each component mounting operation.

Also, the image processing device may be configured to perform, in addition to a pickup orientation determination mode for determining whether the pickup orientation of the component is acceptable, a nozzle section determination mode for determining a good-bad condition of the nozzle section, wherein, in the nozzle section determination mode, before component pickup operation, or after component mounting operation, the camera captures a side view image of an area around the lower end of the nozzle section, the side view image including the lower end of the nozzle section and the height position reference section, the side view image is image processed, the height position reference section and a height position of the lower end of the nozzle section are recognized, a height difference from the height position reference section to the lower end of the nozzle section is measured, and the good-bad condition of the nozzle section is determined based on the height difference. Accordingly, it is possible to accurately determine a good-bad condition of the nozzle section (whether the nozzle section is chipped, or bent, or the like) with only one side view image, without requiring a reference image, and without being influenced by slight variations in the height position of the nozzle section with each component pickup operation and each component mounting operation.

Here, the image processing device, in the nozzle section determination mode, in a case of determining that the measured height difference is larger than a height difference from the height position reference section to the lower end of the nozzle section obtained from specification data of the nozzle section, may determine that the component held on the nozzle section was failed to be mounted on a circuit board and remained on the nozzle section after mounting operation. That is, during image recognition, because it is difficult to accurately distinguish between the lower end of the nozzle section and the lower end of the component captured in one side view image, if a component remains on the nozzle section after mounting operation, the lower end of the component may be misrecognized as the lower end of the nozzle section, and thus be measured as the height difference from the height position reference section to the lower end of the component. Therefore, in nozzle section determination mode, if it is determined that the measured height difference is larger than a height difference from specification data of the nozzle section, it can be accurately determined whether a component has remained on the nozzle section after mounting operation.

Also, the image processing device may be provided with a corrections means that calculates a correction amount of a lowering amount of the nozzle holder during component pickup operation or component mounting operation (a lowering amount of the mounting head that holds the nozzle holder) based on a height position of the height position reference section recognized from the side view image before component pickup operation or before component mounting operation, and corrects the lowering amount of the nozzle holder during component pickup operation or during component mounting operation by the correction amount. That is, the higher the height position of the height position reference section of the nozzle section, the higher the height position of the lower end of the nozzle section, and due to this relationship, it is possible to estimate the height position of the lower end of the nozzle section based on the height position of the height position reference section, thus it is possible to control lowering operation of the nozzle holder (lowering operation of the mounting head) such that the push-in amount of the nozzle section into the nozzle holder during component pickup operation and during component mounting operation is fixed, making it is possible to prevent component pickup defects and component mounting defects caused by insufficient push-in of the nozzle section, and to prevent damage to the component or the board due to excess push-in of the nozzle section.

Further, the image processing device, in a case in which the height position of the height position reference section recognized from the side view image before component pickup operation or before component mounting operation is higher than a specified error determination value, may determine that a stuck error of the nozzle section has occurred. That is, if a stuck error of the nozzle section occurs, in which the nozzle section gets stuck and is unable to be pushed down due to foreign matter getting caught between sliding sections of the nozzle holder and the nozzle section during component pickup operation or component mounting operation, component pickup errors or component mounting errors may occur, and the impact-lessening effect may be lost causing damage to the component and the circuit board, therefore it is necessary to detect a stuck error of the nozzle section quickly. Because the height position of the nozzle holder during imaging is fixed, the higher the height position of the height position reference section of the nozzle section, the larger the push-in amount (push amount) of the nozzle section with respect to the nozzle holder. Due to this relationship between the height position of the height position reference section and the push-in amount of the nozzle section, if the height position of the height position reference section is higher than a specified error determination value, it can be determined that the push-in amount of the nozzle section with respect to the nozzle holder is abnormally large (the nozzle section is stuck and unable to be pushed down), and that a stuck error of the nozzle section has occurred.

DESCRIPTION OF EMBODIMENTS

An embodiment for performing the present disclosure applied as a rotary type component mounter is described below using the drawings. First, the configuration of rotary head 11 (a rotary type mounting head) of a component mounter is described with reference to FIGS. 1 and 2.

Figure 1:
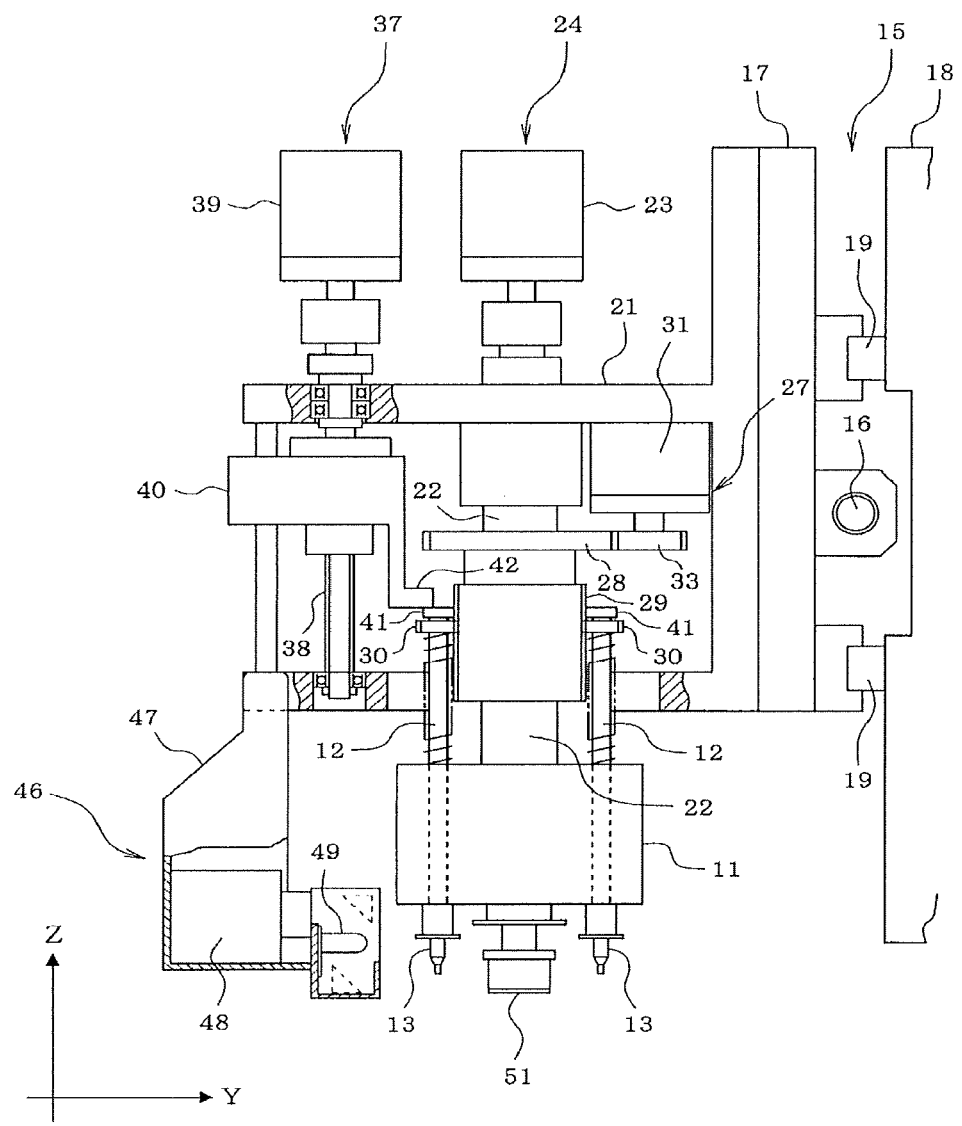
FIG. 1 is a front view showing the configuration of a rotary head and surrounding portions of a component mounter that is an embodiment of the present disclosure.

As shown in FIG. 1, multiple nozzle holders 12 are supported on rotary head 11 at a specified interval in a circumferential direction so as to be capable of being raised and lowered, and nozzle section 13 for picking up a component is engaged with and supported on each nozzle holder 12 so as to be exchangeable and movable vertically. Note that, in FIG. 1, only two nozzle holders 12 (nozzle sections 13) are shown, the other nozzle holders 12 (nozzle sections 13) are omitted.

Figure 2:
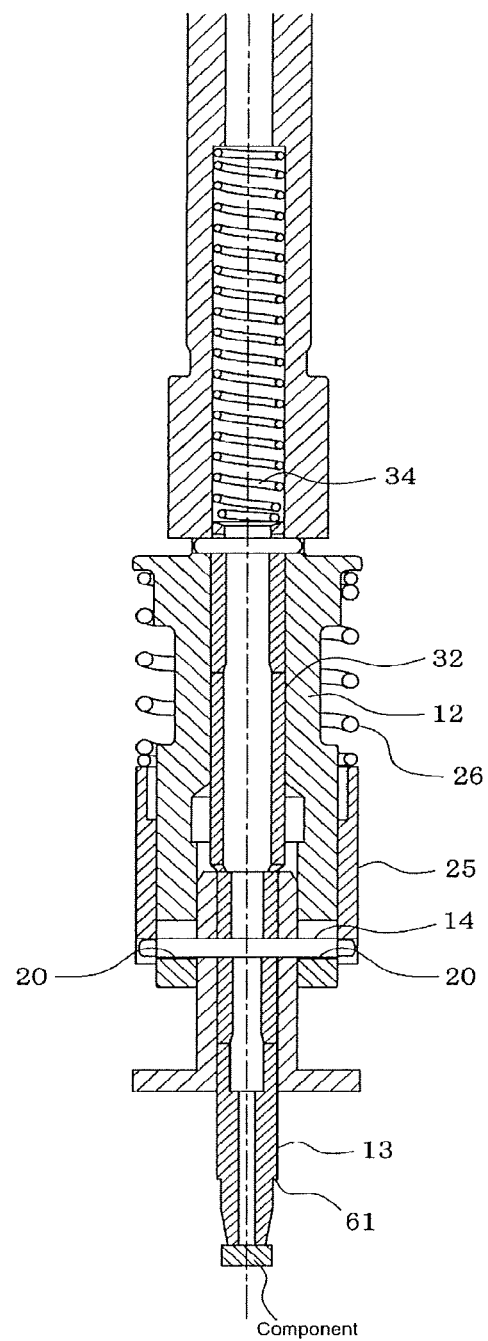
FIG. 2 is an enlarged cross section of a nozzle holder and a nozzle section.

As shown in FIG. 2, engaging pin 14 is fixed to an upper section of nozzle section 13 in a state pierced through in a horizontal direction (diameter direction of nozzle section 13), and both ends of this engaging pin 14 are removably engaged with reverse-L-shaped engaging grooves 20 formed at two locations on a lower section of nozzle holder 12. Tubular retaining member 25 for retaining both ends of engaging pin 14 is engaged with an outer circumferential surface of nozzle holder 12 so as to be movable vertically, and by biasing this retaining member 25 downwards by spring 26 (biasing means), the engaged state of engaging pin 14 is maintained, in which both ends of engaging pin 14 are retained by retaining member 25. Engaging groove 20 of nozzle holder 12 is formed such that the width of the groove in the vertical direction is wide enough to allow the vertical movement of engaging pin 14, and the push-in amount (push amount) of nozzle section 13 with respect to nozzle holder 12 is variable within the groove width in the vertical direction of engaging groove 20.

Pipe-shaped nozzle piston 32 is engaged inside nozzle holder 12 so as to be vertically movable, and by biasing this nozzle piston 32 downwards using spring 34 (biasing means), the lower end surface of nozzle piston 32 is held in a state contacting the upper end surface of nozzle section 13. Thus, nozzle section 13 is engageably held so as to be vertically movable with respect to nozzle holder 12 in a state being biased downwards by two springs, 26 and 34.

Also, as shown in FIG. 1, head moving mechanism 15 that moves rotary head 11 in XY directions is an XY robot provided with X-axis slide 17 that is slid by X-axis ball screw 16 in an X-axis direction (a direction perpendicular to the surface of the page of FIG. 1) that is a board conveyance direction, and Y-axis slide 18 that is moved by a Y-axis ball screw (not shown) in a Y-axis direction that is perpendicular to the X-axis direction. X-axis slide 17 is supported on X-axis guide rails 19 provided on Y-axis slide 18 so as to be slidable in the X-axis direction, and Y-axis slide 18 is supported on Y-axis guide rails (not shown) provided on the main body side of the component mounter so as to be slidable in the Y-axis direction.

Support frame 21 of rotary head 11 is detachably attached to X-axis slide 17. Rotary head 11 is engaged with a lower end of R axis 22 (also referred to as an index axis) that extends in a vertical direction, and the upper section of R axis 22 is supported on support frame 21 so as to be rotatable. R axis 22 is rotated by R-axis motor 23 that is fixed to the support frame 21 side. By rotating rotary head 11 around R axis 22 at the center by rotating R axis 22, the multiple nozzle holders 12 supported on rotary head 11 revolve together with the multiple nozzle sections 13 in a circumferential direction of rotary head 11. R-axis driving mechanism 24 is configured from R-axis motor 23 and R-axis 22 and so on.

Q-axis gears 28 and 29 provided at two levels in the vertical direction of Q-axis driving mechanism 27 are rotatably inserted into R axis 22; gear 30 that engages with an upper end of each nozzle holder 12 is engaged with lower level Q-axis gear 29. Gear 33 connected to Q-axis motor 31 fixed to the support frame 21 side is engaged with upper level Q-axis gear 28; by the rotation of gear 33 of Q-axis motor 31, Q-axis gears 28 and 29 rotate together, such that each gear 30 engaged with lower level Q-axis gear 29 rotates, causing each nozzle holder 12 to rotate about its own center axis (Q axis), thereby correcting the direction (angle) of each component picked up by each nozzle section 13 supported on each nozzle holder 12. Note that, the Q axis is also referred to as the θ axis.

Further, Z-axis driving mechanism 37 that individually lowers nozzle holders 12 is provided to a side of R-axis driving mechanism 24, and the configuration is such that nozzle holders 12 are individually lowered at a specified position on the revolving path of nozzle holders 12 in order to lower the nozzle section 13 supported on the nozzle holder 12. Z-axis driving mechanism 37 may be provided at only one location on the circumference of rotary head 11, or may be provided at two or more locations.

Z-axis driving mechanism 37 uses Z-axis motor 39 to rotate Z-axis ball screw 38 that is rotatably supported on the support frame 21 side to move Z-axis slide 40 in a vertical direction, thereby engaging (contacting) engaging member 42 of Z-axis slide 40 into upper end flange 41 of nozzle holder 12 from above, such that nozzle holder 12 moves vertically. In this case, by each nozzle holder 12 being biased upwards by spring 43 attached to each nozzle holder 12, upper end flange 41 of each nozzle holder 12 is supported in a state engaged (contacted) from below by engaging member 42 of Z-axis slide 40, and as engaging member 42 of Z-axis slide 40 is raised, the nozzle holder 12 is raised due to the pushing force of spring 43.

Also, imaging device 46 that images a component picked up by nozzle section 13 from the side is arranged on a side of rotary head 11. Imaging device 46 is configured from items such as illumination light source 49 and camera 48 fixed to support frame 21 via holder 47. The height position of camera 48 is set such that, when nozzle section 13 is raised to an upper limit position (standby position) of a raising and lowering range so as to be on standby after component pickup operation, both a component held on the lower end of nozzle section 13 and height position reference section 61 of nozzle section 13, which is described later, are within a field of view of camera 48, such that a side view image of an area around the lower end of nozzle section 13 can be captured.

Also, cylinder-shaped light reflecting plate 51, which reflects illumination light from illumination light source 49 when camera 48 is capturing an image from the side of the component held by nozzle section 13 and height position reference section 61, is provided at a central section of the lower surface side of rotary head 11. The height position of the lower end of light reflecting plate 51 is set such that light reflecting plate 51 does not interfere with components or the like when nozzle section 13 is lowered and the component picked up.

Figure 3:
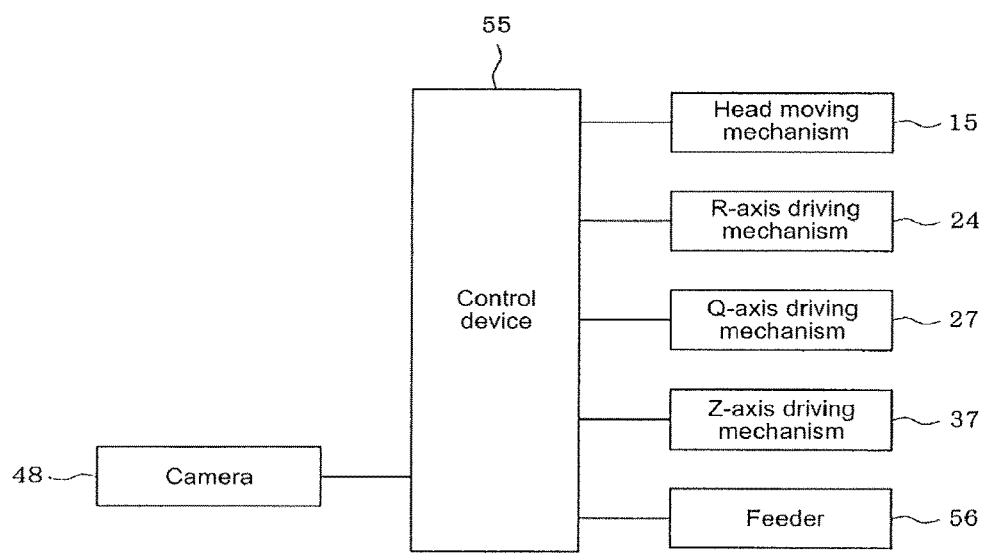
FIG. 3 is a block diagram showing the configuration of control items of the component mounter.

Control device 55 (refer to FIG. 3) of the component mounter controls operation of R-axis driving mechanism 24, Q-axis driving mechanism 27, and Z-axis driving mechanism 37, so as to pick up a component supplied from feeder 56 (refer to FIG. 3) using nozzle section 13 and mount the component on a circuit board.

Further, control device 55 of the component mounter, by performing the image processing programs shown in FIGS. 6 and 7, which are described later, functions as the image processing device that processes a side view image of an area around the lower end of nozzle section 13 captured by camera 48 and determines whether a pickup orientation of the component is acceptable, or the like, and, when the pickup orientation of the component is determined to be unacceptable, discards the component to a specified discard location, or loads the component on a collection conveyor (not shown) to be collected.

Figure 4:
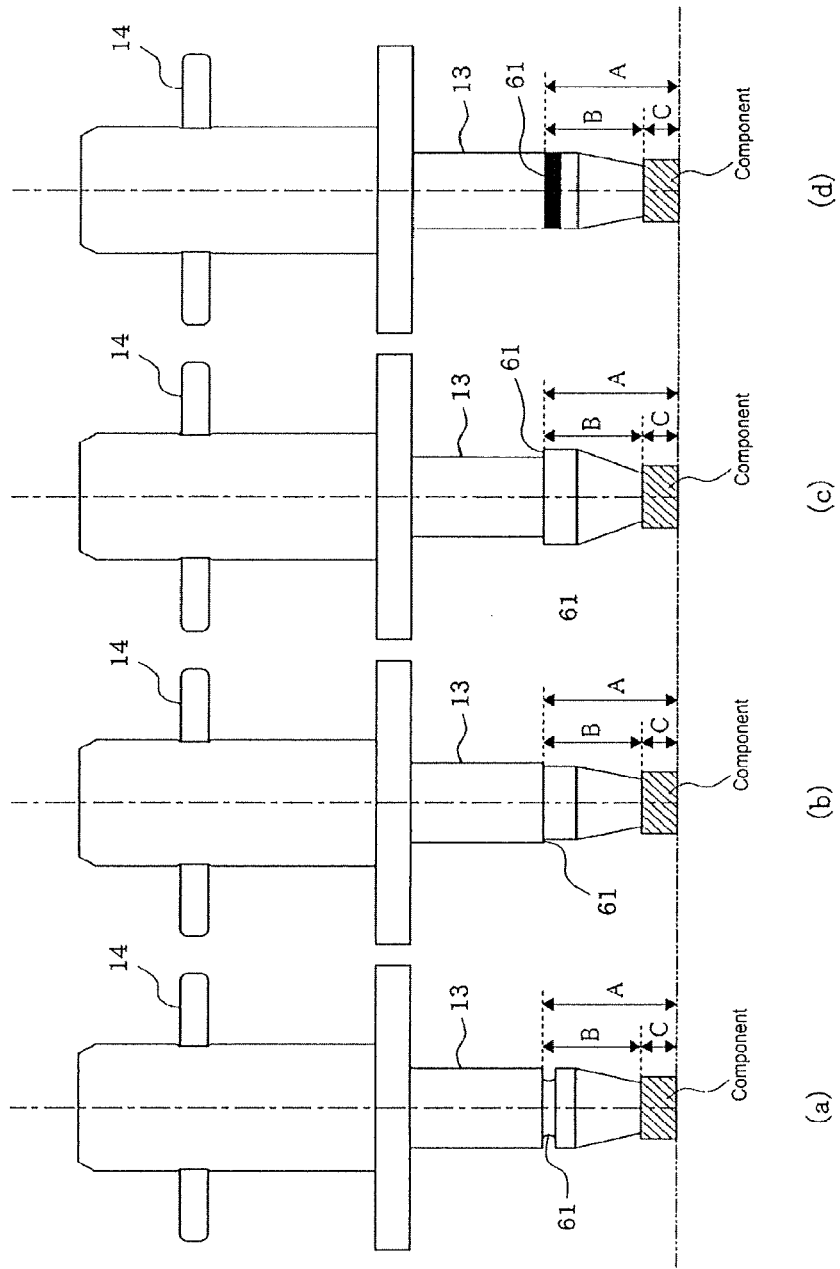
FIGS. 4(a) to (d) show front views of the nozzle section to illustrate four operation states of a height position reference section.

In the present embodiment, height position reference section 61 for which image recognition is possible is provided on an outer circumferential section of nozzle section 13, in order to improve the determination accuracy of the pickup orientation of the component or the like by image processing. For example, any of the items shown in FIGS. 4(*a*) to (*d*) may be used as height position reference section 61: as shown in FIG. 4(*a*), a groove formed in a ring around an outer circumferential section of nozzle section 13 may be used as height position reference section 61; as shown in FIG. 4(*b*), a level difference whereby a lower side with a smaller diameter is formed on an outer circumferential section of nozzle section 13 may be used as height position reference section 61; as shown in FIG. 4(*c*), a level difference whereby a lower side with a larger diameter is formed on an outer circumferential section of nozzle section 13 may be used as height position reference section 61; or, as shown in FIG. 4(*d*), a line for which image recognition is possible (for example, a white line or the like) formed in a ring around an outer circumferential section of nozzle section 13 may be used as height position reference section 61; in other words, any item for which clear image recognition of height position reference section 61 is possible from the side view image of the area around nozzle section 13 that includes height position reference section 61. However, the shape, position, color, and the like of height position reference section 61 must be set such that, when performing image recognition of a rotation angle of the component or a deviation of the pickup position of the component with respect to nozzle section 13 by capturing an image of the component held on nozzle section 13 from below using a component camera (not shown), height position reference section 61 must not overlap the lower surface image of the component, or, if the component lower surface image and height position reference section 61 do overlap, it must be possible to clearly distinguish the component from height position reference section 61.

Also, the height position at which to provide height position reference section 61 on the outer circumferential section of nozzle section 13 may be a height position such that recognition is possible with height position reference section 61 and the component included in a single side view image but separated by a gap; however, if the gap separating height position reference section 61 and the component is too large, the component size as shown in the side view image will be too small, and the recognition accuracy of the lower end position of the component will be worse, therefore, the gap separating height position reference section 61 and the component should be relatively small.

When determining whether the pickup orientation of the component held on the lower end of nozzle section 13 is acceptable, both the component held on the lower end of nozzle section 13 and height position reference section 61 of nozzle section 13 are within the field of view of camera 48, and a side view image of the area around the lower end of nozzle section 61 including the component and height position reference section 61 is captured by camera 48, then the side view image is image processed by control device 55, the height positions of the lower end of the component and height position reference section 61 are recognized, height difference A (refer to FIG. 5) from height position reference section 61 to the lower end of the component is measured, and whether the pickup orientation of the component is acceptable is determined based on the height difference A.

Figure 5:
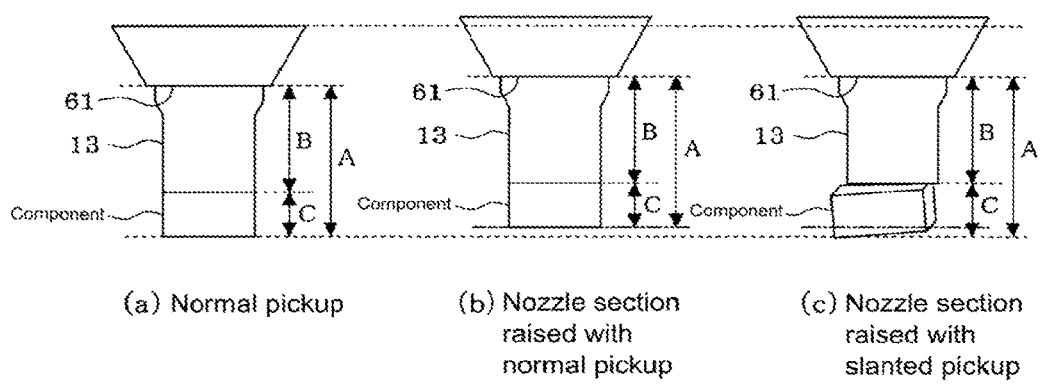
FIGS. 5(a) to (c) illustrate the principle of recognizing the height position reference section and determining whether a pickup orientation of a component is acceptable.

Here, because height difference B from height position reference section 61 of nozzle section 13 to the lower end of nozzle section 13 is a known value from specification data (design value, reference value, dimension management data from manufacturing, or the like) of nozzle section 13, it is possible to accurately estimate the height dimension C (=A−B) of the component captured in the side view image as pickup orientation information from the measured value of height difference A from height position reference section 61 of nozzle section 13 to the lower end of the component. As shown in FIGS. 5(*a*) to (*c*), the height position of nozzle section 13 varies slightly with each component pickup operation and each component mounting operation due to friction, adhered foreign matter, or the like, but because height position reference section 61 of nozzle section 13 and nozzle section 13 move vertically together, height difference A from height position reference section 61 of nozzle section 13 to the lower end of the component is not influenced at all by slight variations in the height position of nozzle section 13, thus it is possible to accurately determine whether the pickup orientation of the component is acceptable by estimating height dimension C (=A−B) of the component held on the lower end of nozzle section 13 based on height difference A from height position reference section 61 of nozzle section 13 to the lower end of the component.

For example, in a case in which component height dimension C estimated based on height difference A from height position reference section 61 of nozzle section 13 to the lower end of the component matches the component height dimension obtained from the specification data (design value, reference value, dimension management data from manufacturing, or the like) of the component, the pickup orientation is determined to be correct, but in a case in which these do not match, the pickup orientation is determined to be incorrect (for example, tombstoned pickup, slanted pickup, or the like). Also, in a case in which the component height dimension C (=A−B) is estimated to be zero, because this indicates that a component is not being held on the lower end of nozzle section 13, it is determined that a component pickup error occurred in which the component was failed to be picked up.

Further, in the present embodiment, control device 55 of the component mounter, in addition to a pickup orientation determination mode for determining whether the pickup orientation of the component is acceptable, performs a nozzle section determination mode for determining a good-bad condition of nozzle section 13, wherein, in the nozzle section determination mode, before component pickup operation, or after component mounting operation, camera 48 captures a side view image of an area around the lower end of nozzle section 13, the side view image including the lower end of nozzle section 13 and height position reference section 61, the side view image is image processed, height position reference section 61 and a height position of the lower end of nozzle section 13 are recognized, height difference B from height position reference section 61 to the lower end of nozzle section 13 is measured, and the good-bad condition of nozzle section 13 (whether nozzle section 13 is chipped, bent, or the like) is determined based on whether the measured value of height difference B matches the height difference from height position reference section 61 to the lower end of nozzle section 13 obtained from the specification data (design value, reference value, dimension management data from manufacturing, or the like).

In the nozzle section determination mode, in a case in which it is determined that the measured height difference B is larger than the height difference from height position reference section 61 to the lower end of nozzle section 13 obtained from specification data of nozzle section 13, it is determined that the component held on nozzle section 13 was failed to be mounted on a circuit board and remained on nozzle section 13 after mounting operation. That is, during image recognition, because it is difficult to accurately distinguish between the lower end of the nozzle section and the lower end of the component captured in one side view image, if a component remains on nozzle section 13 after mounting operation, the lower end of the component may be misrecognized as the lower end of nozzle section 13, and thus be measured as the height difference from height position reference section 61 to the lower end of the component. Therefore, in nozzle section determination mode, if it is determined that the measured height difference is larger than a height difference from height position reference section 61 to the lower end of nozzle section 13 from the specification data of nozzle section 13, it can be accurately determined whether a component has remained on the nozzle section after mounting operation.

Also, control device 55 of the component mounter is provided with a correction means configured to calculate a correction amount of a lowering amount of nozzle holder 12 (a lowering amount of the mounting head that holds nozzle holder 12) during component pickup operation or component mounting operation based on a height position of height position reference section 61 of nozzle section 13 recognized from the side view image of the area around the lower end of nozzle section 13 before component pickup operation or before component mounting operation, and correct the lowering amount of nozzle holder 12 during component pickup operation or during component mounting operation by the correction amount. That is, the higher the height position of height position reference section 61 of nozzle section 13, the higher the height position of the lower end of nozzle section 13, and based on this relationship, the height position of the lower end of nozzle section 13 is estimated based on the height position of height position reference section 61, lowering operation of nozzle holder 12 (lowering operation of the mounting head) is controlled such that the push-in amount of nozzle section 13 into nozzle holder 12 during component pickup operation and during component mounting operation is fixed. By this, it is possible to prevent component pickup defects and component mounting defects caused by insufficient push-in of nozzle section 13, and to prevent damage to the component or the board due to excess push-in of nozzle section 13.

Further, control device 55 of the component mounter, in a case in which the height position of height position reference section 61 recognized from the side view image before component pickup operation or before component mounting operation is higher than a specified error determination value, determines that a stuck error of nozzle section 13 has occurred. That is, if a stuck error of nozzle section 13 occurs, in which nozzle section 13 gets stuck and is unable to be pushed down due to foreign matter getting caught between sliding sections of nozzle holder 12 and nozzle section 13 during component pickup operation or component mounting operation, component pickup errors or component mounting errors may occur, and the impact-lessening effect may be lost causing damage to the component and the circuit board, therefore it is necessary to detect a stuck error of nozzle section 13 quickly. Because the height position of nozzle holder 12 during imaging is fixed at the standby position, the higher the height position of height position reference section 61 of nozzle section 13, the larger the push-in amount (push amount) of nozzle section 13 with respect to nozzle holder 12. Due to this relationship between the height position of height position reference section 61 and the push-in amount of nozzle section 13, if the height position of height position reference section 61 is higher than a specified error determination value, it can be determined that the push-in amount of nozzle section 13 with respect to nozzle holder 12 is abnormally large (nozzle section 13 is stuck and unable to be pushed down), and that a stuck error of nozzle section 13 has occurred.

Figure 6:
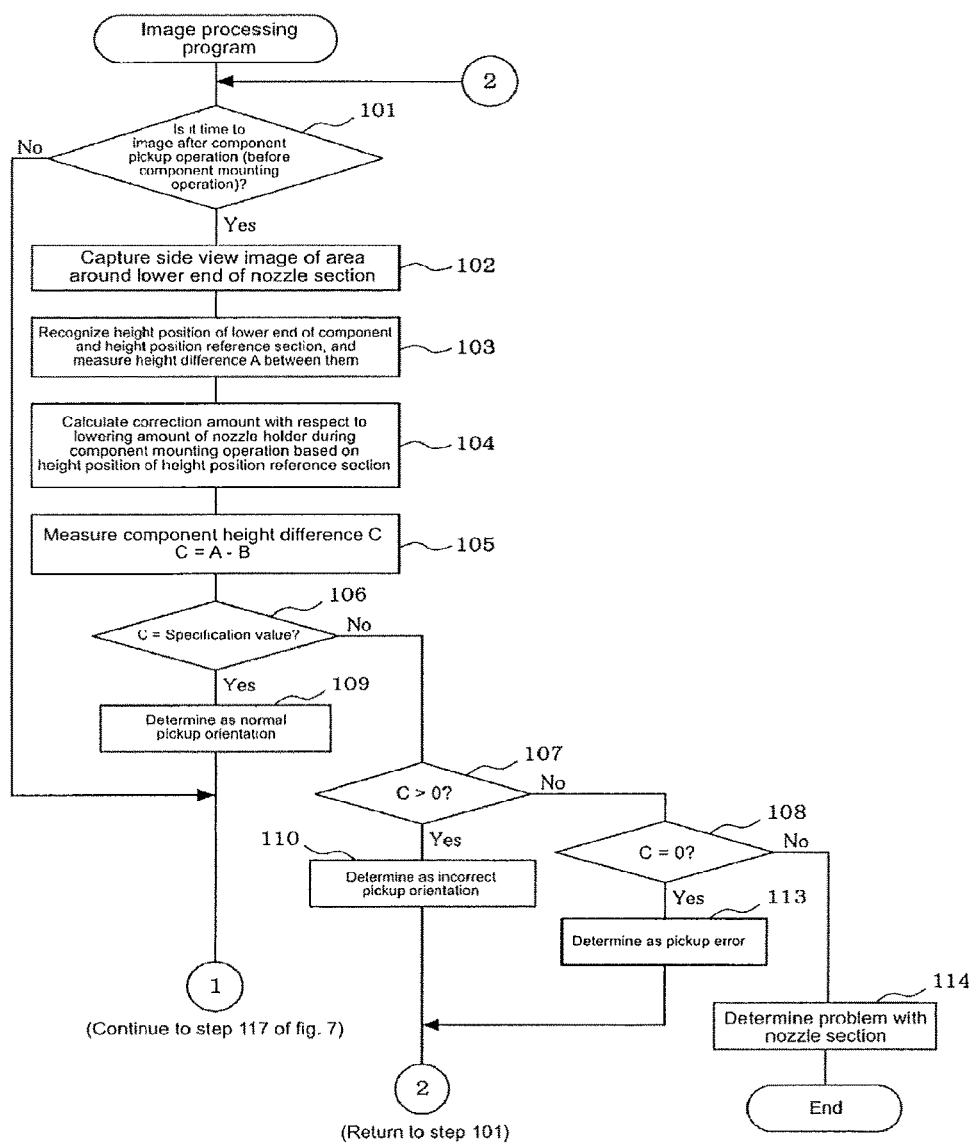
FIG. 6 is a (first) flowchart showing the processing flow of an image processing program.
Figure 7:
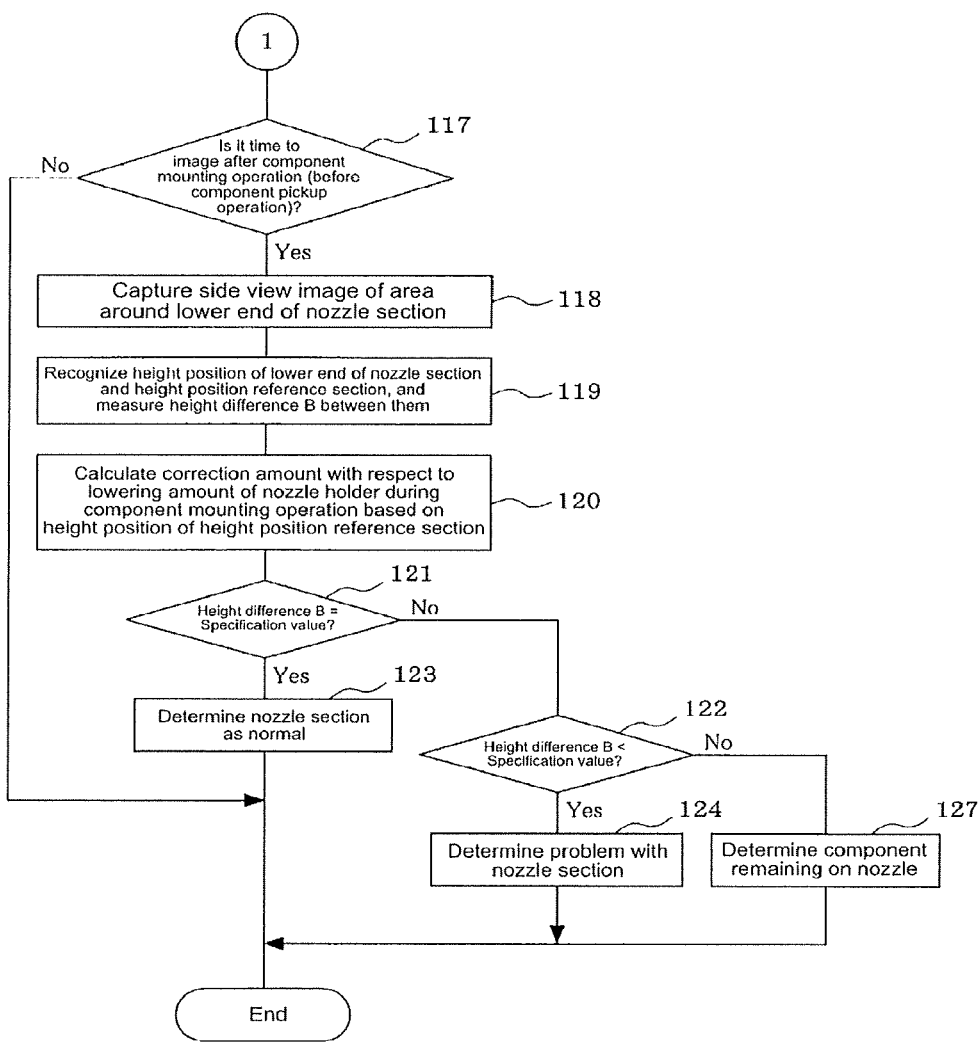
FIG. 7 is a (second) flowchart showing the processing flow of an image processing program.

Image processing of the present embodiment as described above is performed periodically by control device 55 performing the image processing programs of FIGS. 6 and 7 during operation (during production) of the component mounter. Processing of the image processing programs of FIGS. 6 and 7 is described below. When a program above is started, first, in step 101, it is determined whether it is time to perform imaging after component pickup operation (before component mounting operation); if it is determined that it is not time to perform imaging after component pickup operation (before component mounting operation), processing proceeds to step 117 of FIG. 7.

On the other hand, in the above step 101, if it is decided that it is time to perform imaging after component pickup operation (before component mounting operation), processing continues to step 102, both the component held on the lower end of nozzle section 13 and height position reference section 61 of nozzle section 13 are caused to be within the field of view of camera 48, and camera 48 captures a side view image of the area around the lower end of nozzle section 61 that includes the component and height position reference section 61.

Then, continuing to step 103, the side view image of the area around the lower end of nozzle section 61 is processed, height position reference section 61 and the height position of the lower end of the component are recognized, and height difference A from height position reference section 61 to the lower end of the component is measured. Then, continuing to step 104, a correction amount with respect to the lowering amount of nozzle holder 12 (lowering amount of the mounting head) during component mounting operation is calculated based on the height position of the height position reference section 61 of nozzle section 13. Accordingly, by correcting the lowering amount of nozzle holder 12 (lowering amount of the mounting head) during component mounting operation, the lowering operation of nozzle holder 12 (lowering operation of the mounting head) is controlled such that the push-in amount of nozzle section 13 pushed into nozzle holder 12 during component mounting operation is fixed.

Then, continuing to step 105, height dimension C of the component held on the lower end of nozzle section 13 is measured based on the following formula.

$$C = A - B$$

A: Measured value of height difference from height position reference section 61 to lower end of component B: Specification value of height difference from height position reference section 61 to lower end of nozzle section 13

Then, continuing to step 106, it is determined whether the measured value of height dimension C of the component held on the lower end of nozzle section 13 matches the specification value (design value, standard value, or the like) of the height dimension of the component. Here, if the difference between the two is within a range of a measurement error of the image processing, a match is determined, processing continues to step 109, it is determined that the pickup orientation is correct, and processing continues to step 117 of FIG. 7.

On the other hand, in step 106 above, if it is determined that the measurement value of height dimension C of the component does not match the specification data, processing continues to step 107 and it is determined that the measurement value of height dimension C of the component is a positive value. As a result, if it is determined that the measurement value of height dimension C of the component is a positive value, processing continues to step 110, and it is determined that the pickup orientation is incorrect (defective pickup orientation). In this case, the component for which the pickup orientation was determined to be incorrect is discarded to a discard location, or loaded on a collection conveyor (not shown) and collected, component pickup operation is retried (performed again), processing returns to step 101, and the above processing is repeated.

On the other hand, in step 107 above, if it is determined that the measurement value of height dimension C of the component is not a positive value, processing continues to step 108 and it is determined that the measurement value of height dimension C of the component is zero. In this case, if the difference between the measurement value of height dimension C of the component and zero is within a range of a measurement error of image processing, it is determined that the measurement value of height dimension C of the component is zero. In this state, because this means that no component is being held on the lower end of nozzle section 13, processing continues to step 113, a component pickup error is determined, processing continues to step 112, component pickup operation is retried, processing returns to step 101, and the above processing is repeated.

On the other hand, if "No" is determined in both steps 107 and 108, that is, if the measurement value of height dimension C of the component is a negative value, because this means that the height difference from height position reference section 61 to the lower end of nozzle section 13 is short compared to a specification value, processing continues to step 114, and it is determined that there is a problem with nozzle section 13 (nozzle section 13 is chipped, bent, or the like). In this case, a warning display or sound warns the operator, and operation of the component mounter stops with an error.

In the above step 109, if it is determined that the pickup orientation is normal, processing continues to step 117 of FIG. 7, and it is determined whether it is time to capture an image after component mounting operation (before component pickup operation); if it is determined that it is not time to capture an image after component mounting operation (before component pickup operation), the program ends without further processing.

On the other hand, in the above step 117, if it is determined that it is time to capture an image after component mounting operation (before component pickup operation), processing continues to step 118, the lower end of nozzle section 13 and height position reference section 61 are caused to be within the field of view of camera 48, and camera 48 captures a side view image of the area around the lower end of nozzle section 61 that includes the lower end of nozzle section 13 and height position reference section 61.

Then, continuing to step 119, the side view image of the area around the lower end of nozzle section 61 is processed, height position reference section 61 and the height position of the lower end of nozzle section 13 are recognized, and height difference B from height position reference section 61 to the lower end of nozzle section 13 is measured. Then, continuing to step 120, a correction amount with respect to the lowering amount of nozzle holder 12 (lowering amount of the mounting head) during component pickup operation is calculated based on the height position of the height position reference section 61 of nozzle section 13. Accordingly, by correcting the lowering amount of nozzle holder 12 (lowering amount of the mounting head) during component pickup operation, the lowering operation of nozzle holder 12 (lowering operation of the mounting head) is controlled such that the push-in amount of nozzle section 13 pushed into nozzle holder 12 during component pickup operation is fixed.

Then, continuing to step 121, it is determined whether the measurement value of height difference B from height position reference section 61 to the lower end of nozzle section 13 measured in step 119 above matches the specification value. Here, if the difference between the two is within a range of the measurement error of image processing, it is determined that they match, processing continues to step 123, nozzle section 13 is judged to be normal, and the program ends.

On the other hand, in step 121 above, if it is determined that the measurement value of height difference B from height position reference section 61 to the lower end of nozzle section 13 and the specification value do not match, processing continues to step 122, and it is determined whether the measurement value of height difference B from height position reference section 61 to the lower end of nozzle section 13 is smaller than the specification value. As a result, if it is determined that the measurement value of height difference B from height position reference section 61 to the lower end of nozzle section 13 is smaller than the specification value, because this means that the measurement value of height difference B from height position reference section 61 to the lower end of nozzle section 13 is short compared to the specification value, processing continues to step 124, and it is determined that there is a problem with nozzle section 13 (nozzle section 13 is chipped, bent, or the like). In this case, a warning display or sound warns the operator, and operation of the component mounter stops with an error.

On the other hand, if "No" is determined in both steps 121 and 122, that is, the measurement value of height difference B from height position reference section 61 to the lower end of nozzle section 13 is larger than the specification value, because this means that a component is adhered to the lower end of nozzle section 13, processing continues to step 127 and it is determined that the component has remained on nozzle section 13 after mounting operation. In this case, too, a warning display or sound warns the operator, and operation of the component mounter stops with an error.

Note that, in the image processing programs of FIGS. 6 and 7, processing for determining whether a stuck error of nozzle section 13 occurred based on the height position of height position reference section 61 is omitted, but processing may be added such that, each time a side view image of the area around the lower end of nozzle section 13 is captured and the height position of height position reference section 61 of nozzle section 13 recognized, it is determined whether the height position of height position reference section 61 is higher than a specified error determination value, and in a case in which the height position of height position reference section 61 is higher than the specified error determination value, it is determined that the push-in amount of nozzle section 13 without respect to nozzle holder 12 is large (nozzle section 13 is stuck and cannot be pushed down), and it is determined that a stuck error of nozzle section 13 has occurred.

According to the above embodiment, nozzle section 13 has height position reference section 61 for which image recognition is possible provided on an outer circumference of nozzle section 13, both the component held on the lower end of nozzle section 13 and height position reference section 61 are caused to enter a field of view of camera 48, a side view image of an area around the lower end of nozzle section 13 is captured, and the position reference section 61 and a height position of a lower end of the component are recognized from the side view image; therefore, it is possible to determine with good accuracy a height difference A from height position reference section 61 of nozzle section 13 to the lower end of the component with only one side view image, without requiring a reference image, and, from the measurement value of height difference A, it is possible to determine with good accuracy height dimension C of the component as shown in the side view image as information of the pickup orientation. This height difference A from height position reference section 61 of nozzle section 13 to the lower end of the component is not influenced at all by slight variations in the height position of nozzle section 14, thus it is possible to accurately determine whether the pickup orientation of the component is acceptable based on height dimension C of the component estimated from the height difference A. Thus, it is possible to accurately determine whether the pickup orientation of the component is acceptable with only one side view image, without requiring a reference image, and without being influenced by slight variations in the height position of nozzle section 13 with each component pickup operation and each component mounting operation.

Also, because before component pickup operation, or after component mounting operation, camera 48 captures a side view image of an area around the lower end of nozzle section 13, the side view image including the lower end of nozzle section 13 and height position reference section 61, the side view image is processed, height difference B from height position reference section 61 to the lower end of nozzle section 13 is measured, and it is determined whether nozzle section 13 is acceptable based on the height difference B, it is possible to accurately determine a good-bad condition of nozzle section 13 (with the section is chipped, or bent, or the like) with only one side view image, without requiring a reference image, and without being influenced by slight variations in the height position of nozzle section 13 with each component pickup operation and each component mounting operation.

Further, when it is determined that the measurement value of height difference B from height position reference section 61 to the lower end of nozzle section 13 is larger than a specification value such as a design value, it is determined that the component remained on the nozzle section after mounting operation, therefore it is possible to accurately determine whether the component remained on the nozzle section after mounting operation.

Also, because a correction amount of a lowering amount of nozzle holder 12 (a lowering amount of the mounting head) during component pickup operation or component mounting operation is calculated based on a height position of height position reference section 61 recognized from the side view image of the area around the lower end of nozzle section 13 before component pickup operation or before component mounting operation, and the lowering amount of nozzle holder 12 during component pickup operation or during component mounting operation is corrected by the correction amount, it is possible to estimate the height position of the lower end of nozzle section 13 based on the height position of height position reference section 61 and to control lowering operation of nozzle holder 12 such that the push-in amount of the nozzle section pushed into nozzle holder 12 during component pickup operation and during component mounting operation is fixed, and it is possible to prevent component pickup defects and component mounting defects caused by insufficient push-in of nozzle section 13, and to prevent damage to the component or the board due to excess push-in of nozzle section 13.

Note that, the present disclosure is not limited to a rotary-type component mounter provided with rotary head 11, and it goes without saying that various changes may be made without departing from the scope of the disclosure, such as applying the disclosure to a component mounter provided with a mounting head that does not rotate.

REFERENCE SIGNS LIST

11: rotary head (mounting head); 12: nozzle holder; 13: nozzle section; 15: head moving mechanism; 24: R-axis driving mechanism; 26: spring (biasing means); 27: Q-axis driving mechanism; 34: spring (biasing means); 37: Z-axis driving mechanism; 46: imaging device; 48: camera; 49: illumination light source; 51: light reflecting plate; 55: control device (image processing device, correction means)

The invention claimed is:

1. A component mounter comprising:
a nozzle section held in a nozzle holder to be vertically movable and biased downwards by a biasing means, the nozzle section having a height position reference section for which image recognition is possible provided on an outer circumference of the nozzle section;
a camera configured to capture a side view image of a component held on a lower end of the nozzle section;
an image processing device configured to determine whether a pickup orientation of the component is acceptable by processing the side view image;
wherein
both the component held on the lower end of the nozzle section and the height position reference section are caused to enter a field of view of the camera,
the camera captures a side view image of an area around the lower end of the nozzle section,
the side view image including the component and the height position reference section, and
the image processing device processes the side view image, recognizes the height position reference section and a height position of a lower end of the component, measures a first height difference from the height position reference section to the lower end of the component, calculates a height dimension of the component based on a difference between the first height difference and a specification data of the nozzle section including a second height difference between the height position reference section and the lower end of the nozzle section, determines that a pickup orientation of the component is acceptable when the calculated height dimension of the component matches a predetermined value, determines that the pickup orientation of the component is incorrect when the calculated height dimension of the component does not match the predetermined value and is greater than zero, determines that a pickup error has occurred when the calculated height dimension of the component is equal to zero, and determines that there is a problem with the nozzle section when the calculated height dimension of the component is less than zero.

2. The component mounter according to claim 1, wherein the image processing device is configured to perform, in addition to a pickup orientation determination mode for determining whether the pickup orientation of the component is acceptable, a nozzle section determination mode for determining a good-bad condition of the nozzle section,
wherein,
in the nozzle section determination mode, before component pickup operation, or after component mounting operation, the camera captures a side view image of an area around the lower end of the nozzle section, the side view image including the lower end of the nozzle section and the height position reference section, the side view image is image processed, the height position reference section and a height position of the lower end of the nozzle section are recognized, the second height difference from the height position reference section to the lower end of the nozzle section is measured, and the good-bad condition of the nozzle section is determined based on the measured second height difference.

3. The component mounter according to claim 2, wherein the image processing device, in the nozzle section determination mode, in a case of determining that the measured second height difference is larger than the specification data of the nozzle section including the second height difference, determines that the component held on the nozzle section was failed to be mounted on a circuit board and remained on the nozzle section after mounting operation.

4. The component mounter according to claim 1, wherein the image processing device is provided with a correction means configured to calculate a correction amount of a lowering amount of the nozzle holder during component pickup operation or component mounting operation based on a height position of the height position reference section recognized from the side view image before component pickup operation or before component mounting operation, and correct the lowering amount of the nozzle holder during component pickup operation or during component mounting operation by the correction amount.

5. The component mounter according to claim 4, wherein the image processing device, in a case in which the height position of the height position reference section recognized from the side view image before component pickup operation or before component mounting operation is higher than a specified error determination value, determines that a stuck error of the nozzle section has occurred.

6. A component mounter comprising:
a nozzle section held in a nozzle holder to be vertically movable and biased downwards by a biasing means, the nozzle section having a height position reference section for which image recognition is possible provided on an outer circumference of the nozzle section;
a camera configured to capture a side view image of a component held on a lower end of the nozzle section;
an image processing device configured to determine whether a pickup orientation of the component is acceptable by processing the side view image;
wherein
both the component held on the lower end of the nozzle section and the height position reference section are caused to enter a field of view of the camera,
the camera captures a side view image of an area around the lower end of the nozzle section,
the side view image including the component and the height position reference section,
the image processing device processes the side view image, recognizes the height position reference section and a height position of a lower end of the component, measures a first height difference from the height position reference section to the lower end of the component, and determines whether a pickup orientation of the component is acceptable based on the first height difference,
the image processing device is configured to perform, in addition to a pickup orientation determination mode for determining whether the pickup orientation of the component is acceptable, a nozzle section determination mode for determining a good-bad condition of the nozzle section, and
in the nozzle section determination mode, before component pickup operation, or after component mounting operation, the camera captures a side view image of an area around the lower end of the nozzle section, the side view image including the lower end of the nozzle section and the height position reference section, the side view image is image processed, the height position reference section and a height position of the lower end of the nozzle section are recognized, a second height difference from the height position reference section to the lower end of the nozzle section is measured, and the good-bad condition of the nozzle section is determined based on the second height difference.

7. A component mounter comprising:
a nozzle section held in a nozzle holder to be vertically movable and biased downwards by a biasing means, the nozzle section having a height position reference section for which image recognition is possible provided on an outer circumference of the nozzle section;
a camera configured to capture a side view image of a component held on a lower end of the nozzle section;
an image processing device configured to determine whether a pickup orientation of the component is acceptable by processing the side view image;
wherein
both the component held on the lower end of the nozzle section and the height position reference section are caused to enter a field of view of the camera,
the camera captures a side view image of an area around the lower end of the nozzle section,
the side view image including the component and the height position reference section,
the image processing device processes the side view image, recognizes the height position reference section and a height position of a lower end of the component, measures a height difference from the height position reference section to the lower end of the component, and determines whether a pickup orientation of the component is acceptable based on the height difference,
the image processing device is provided with a correction means configured to calculate a correction amount of a lowering amount of the nozzle holder during component pickup operation or component mounting operation based on a height position of the height position reference section recognized from the side view image before component pickup operation or before component mounting operation, and correct the lowering amount of the nozzle holder during component pickup operation or during component mounting operation by the correction amount, and
the image processing device, in a case in which the height position of the height position reference section recognized from the side view image before component pickup operation or before component mounting operation is higher than a specified error determination value, determines that a stuck error of the nozzle section has occurred.

\* \* \* \* \*